(12) United States Patent
Nguyen et al.

(10) Patent No.: US 8,476,743 B2
(45) Date of Patent: Jul. 2, 2013

(54) C-RICH CARBON BORON NITRIDE DIELECTRIC FILMS FOR USE IN ELECTRONIC DEVICES

(75) Inventors: Son Van Nguyen, Schenectady, NY (US); Alfred Grill, White Plains, NY (US); Thomas J. Haigh, Jr., Claverack, NY (US); Sanjay Mehta, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/228,857

(22) Filed: Sep. 9, 2011

(65) Prior Publication Data
US 2013/0062753 A1    Mar. 14, 2013

(51) Int. Cl.
*H01L 23/58* (2006.01)
*H01L 21/31* (2006.01)
*C23C 8/54* (2006.01)
*B05D 5/12* (2006.01)

(52) U.S. Cl.
USPC .......... 257/649; 257/E21.584; 427/590; 427/113; 438/778; 438/780

(58) Field of Classification Search
None
See application file for complete search history.

(56) References Cited

U.S. PATENT DOCUMENTS

| | | | |
|---|---|---|---|
| 4,885,199 A | 12/1989 | Corbin et al. | |
| 5,356,727 A | 10/1994 | Grenie et al. | |
| 5,605,868 A | 2/1997 | Chyung et al. | |
| 6,623,800 B2 | 9/2003 | Furuichi | |
| 6,690,091 B1 * | 2/2004 | Chooi et al. | 257/758 |
| 7,132,353 B1 * | 11/2006 | Xia et al. | 438/585 |
| 7,427,428 B1 | 9/2008 | DiCarlo et al. | |
| 2008/0173985 A1 * | 7/2008 | Belyansky et al. | 257/649 |
| 2011/0186818 A1 * | 8/2011 | Bowers et al. | 257/29 |

FOREIGN PATENT DOCUMENTS

JP     200280960    3/2002

* cited by examiner

*Primary Examiner* — Julio J Maldonado
*Assistant Examiner* — Harpreet Singh
(74) *Attorney, Agent, or Firm* — Scully, Scott, Murphy & Presser, P.C.; H. Daniel Schnurmann

(57) ABSTRACT

A carbon-rich carbon boron nitride dielectric film having a dielectric constant of equal to, or less than 3.6 is provided that can be used as a component in various electronic devices. The carbon-rich carbon boron nitride dielectric film has a formula of $C_xB_yN_z$ wherein x is 35 atomic percent or greater, y is from 6 atomic percent to 32 atomic percent and z is from 8 atomic percent to 33 atomic percent.

16 Claims, 3 Drawing Sheets

C-RICH CARBON BORON NITRIDE DIELECTRIC FILMS FOR USE IN ELECTRONIC DEVICES

BACKGROUND

The present invention relates to a dielectric film for use in various electronic devices, and more particularly to a carbon-rich carbon boron nitride dielectric film. The present invention also relates to electronic devices including a carbon-rich carbon boron nitride dielectric film, and a method of forming a carbon-rich carbon boron nitride dielectric film.

Continued scaling of electronic devices demands reduced RC (resistance/capacitance) delay for increased clocking speeds in device circuitry. Reduction in parasitic capacitance can be achieved by adopting new materials for use in front end of the line (FEOL) integration and/or back of the line (BEOL) integration. E.g., new dielectric films having a low dielectric constant (k) of less than 4.0 are needed to meet standard BEOL reliability requirements. Also, new dielectric films having a dielectric constant of less than 4.0 are needed for FEOL applications.

SUMMARY

The present disclosure provides a carbon-rich carbon boron nitride dielectric film having a low dielectric constant, k. By "low dielectric constant" or "low k" it is meant that the carbon-rich carbon boron dielectric film of the present disclosure has a dielectric constant equal to, or less than 3.6. By "carbon-rich" it is meant that the carbon boron nitride dielectric film of the present disclosure has a carbon content of 35 atomic percent or greater. The carbon-rich carbon boron nitride dielectric film of the present disclosure can be used as an insulator in various electronic devices including, e.g., as a dielectric cap for an interconnect structure, a spacer for a metal oxide semiconductor (MOS) field effect transistor (FET), or as a dielectric material to be used in a graphene-containing device.

In one embodiment of the present invention, a dielectric film is provided that has a formula of $C_xB_yN_z$ wherein x is 35 atomic percent or greater, y is from 6 atomic percent to 32 atomic percent and z is from 8 atomic percent to 33 atomic percent.

In another embodiment, an electronic device is provided that includes a substrate, and a dielectric film located on a surface of the substrate. The dielectric film that is located on the surface of the substrate has a formula of $C_xB_yN_z$ wherein x is 35 atomic percent or greater, y is from 6 atomic percent to 32 atomic percent and z is from 8 atomic percent to 33 atomic percent.

In yet another embodiment, a method of forming a dielectric film is provided. Specifically, the method of the present disclosure includes providing a substrate into a reactor chamber, providing to the reactor chamber at least one precursor containing at least atoms of C, B and N, and depositing a dielectric film on a surface of the substrate. The dielectric film that is deposited has a formula of $C_xB_yN_z$ wherein x is 35 atomic percent or greater, y is from 6 atomic percent to 32 atomic percent and z is from 8 atomic percent to 33 atomic percent.

DETAILED DESCRIPTION

Figure 1:
FIG. 1 is a cross-sectional view illustrating an initial structure that can be employed in one embodiment of the present invention.

The present disclosure, which relates to a carbon-rich carbon boron nitride dielectric film, electronic devices including a carbon-rich carbon boron nitride dielectric film, and a method of forming a carbon-rich carbon boron nitride dielectric film, will now be described in greater detail by referring to the following discussion and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

It will be understood that when an element as a layer, region, or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, an embodiment of the invention provides a carbon-rich carbon boron nitride dielectric film having a carbon content of 35 atomic percent or greater. In particular, a carbon-rich carbon boron nitride dielectric film is provided that contains atoms of carbon in an amount of 35 atomic or greater, boron in an amount of 6 atomic percent to 32 atomic percent, and nitrogen in an amount from 8 atomic percent to 33 atomic percent. The carbon-rich dielectric film of the present disclosure may also include at least one of oxygen and hydrogen as optional elements. The carbon-rich carbon boron nitride dielectric film of an embodiment of the invention has a dielectric constant of equal to, or less than 3.6.

In one embodiment, the carbon-rich carbon boron nitride dielectric film can be used as an insulator component in various electronic devices including, e.g. as a dielectric cap for an interconnect structure, a spacer for a metal oxide semiconductor (MOS) field effect transistor (FET), or as a dielectric material to be used in a graphene-containing device. When the carbon-rich carbon boron nitride dielectric film can be used as a dielectric cap, the carbon-rich dielectric film reducing the overall effective capacitance of an interconnect structure, and hence, in turn, increase the device performance.

Reference is now made to FIG. 1 which illustrates an initial structure 10 that can be employed in one embodiment of the present invention. The initial structure 10 depicted in FIG. 1 includes a substrate 12. The substrate 12 that can preferably be employed includes a semiconductor material, an insulating material, a conductive material or any combination thereof, including multilayered structures.

In one embodiment, when substrate 12 is, or includes, a semiconductor material, the semiconductor material can be any material having semiconductor properties including, e.g., Si, Ge, SiGe, SiGeC, SiC, GaAs, InAs, InP and other III/V or II/VI compound semiconductors. Layered semiconductor materials such as, e.g., Si/SiGe, Si/Ge, Si/SiC, silicon-on-insulators (SOIs) or silicon germanium-on-insulators (SGOIs) can also be used as the substrate 12.

When substrate 12 is, or includes, an insulating material, the insulating material can be an organic insulator, an inorganic insulator or a combination thereof including multilayers. When the substrate 12 is, or includes, a conductive material, the conductive material 12 may include, e.g., B, P or As doped polySi, an elemental metal, alloys of elemental metals, a metal silicide, a metal nitride and combinations thereof, including multilayers.

In another embodiment, the substrate 12 includes a combination of a semiconducting material and an insulating material, a combination of a semiconducting material and a conductive material or a combination of a semiconducting material, an insulating material and a conductive material.

In another embodiment, substrate 12 is a carbon-based material including, e.g., graphene, graphite and a carbon nanotube. In other embodiments, the carbon-based material can be located atop a base substrate which can be a semiconductor material, a dielectric material, a conductive material or any combination thereof including a multilayered stack.

The term "graphene" is used herein to denote a one-atom-thick planar sheet of $sp^2$-bonded carbon atoms that are densely packed in a honeycomb crystal lattice. The graphene that can be employed as substrate 12 has a hexagonal crystallographic bonding structure. The graphene can include single-layer graphene (nominally 0.34 nm thick), few-layer graphene (2-10 graphene layers), multi-layer graphene (>10 graphene layers), a mixture of single-layer, few-layer, and multi-layer graphene, or any combination of graphene layers mixed with amorphous and/or disordered carbon phases. The also include, if desired, substitutional, and interstitial and/or intercalated dopant species as well. When graphene is employed as substrate 12, graphene can be formed utilizing techniques that are well known in the art. For example, graphene can be formed by mechanical exfoliation of graphite, epitaxial growth on silicon carbide, epitaxial growth on metal substrates, hydrazine reduction in which a graphene oxide paper is placed in a solution of pure hydrazine which reduces the graphene oxide paper into single-layered graphene, and sodium reduction of ethanol, i.e., by the reduction of ethanol by sodium metal, followed by pyrolysis of the ethoxide product and washing to remove sodium salts. Another method of forming graphene can be from carbon nanotubes.

When a carbon nanotube is employed as substrate 12, the carbon nanotube can be single walled or multiwalled. Carbon nanotubes typically have a folded hexagonal crystallographic bonding structure. Although a single carbon nanotube can be used, an array of carbon nanotubes is typically used. When carbon nanotubes are employed as substrate 12, the carbon nanotubes can be formed utilizing techniques that are well known to those skilled in the art. Examples of suitable techniques that can be used in forming carbon nanotubes include, but are not limited to, arc discharge, laser ablation, chemical vapor deposition, and plasma enhanced chemical vapor deposition.

Other possible carbon-based materials that can be employed as substrate 12 include graphite with a short-range hexagonal and amorphous crystallographic bonding structure and various forms of carbon materials with a slightly distorted hexagonal crystallographic bonding structure, such as, e.g., Lonsdaleite or densely packed hexagonal bonding phase fullerene.

Figure 2:
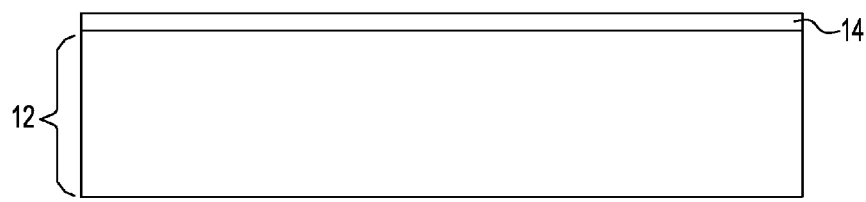
FIG. 2 is a cross-sectional view illustrating the initial structure of FIG. 1 after forming a carbon-rich carbon boron nitride dielectric film thereon.

Referring to FIG. 2, there is illustrated the initial structure 10 of FIG. 1 after forming a carbon-rich carbon boron nitride dielectric film 14 on a surface of substrate 12. As stated above, the carbon-rich carbon boron nitride dielectric film 14 contains atoms of carbon (C), boron (B) and nitrogen (N). The carbon-rich carbon boron nitride dielectric film 14 may also include one of oxygen and hydrogen as optional elements that can be present therein. The carbon-rich carbon boron nitride dielectric film 14 can also be referred to as a carbon-rich dielectric film having a formula of $C_xB_yN_z$ wherein x is the atomic percent of carbon present in the film, y is the atomic percent of boron present in the film and z is the atomic percent of nitrogen present in the film. The values of x, y and z will be discussed in greater detail herein below.

The carbon-rich carbon boron nitride dielectric film 14 of the present disclosure has a dielectric constant that is equal to, or less than 3.6. In one embodiment, the carbon-rich carbon boron nitride dielectric film 14 has a dielectric constant that is from 2.5 to 3.2. All dielectric constants are relative to a vacuum unless otherwise stated. In another embodiment, the carbon-rich carbon boron nitride dielectric film 14 has a dielectric constant that is less than 2.5. In one embodiment, the carbon-rich carbon boron nitride dielectric film 14 is non-porous. In another embodiment, the carbon-rich carbon boron nitride dielectric film 14 is porous. By 'porous' it is meant the film has voids present therein.

As stated above, the carbon-rich dielectric film 14 of the present invention is carbon-rich. By 'carbon-rich', it is meant that the carbon-rich carbon boron nitride dielectric film 14 has a carbon content, i.e., x, of greater than, or equal to, 35 atomic percent. In another embodiment, the carbon content, i.e., x, in the carbon-rich carbon boron nitride dielectric film 14 is from 35 atomic percent to about 70 atomic percent.

The carbon-rich carbon boron nitride dielectric film 14 also includes boron. The boron content, i.e., y, in the carbon-rich carbon boron nitride dielectric film 14 is from 6 atomic percent to 32 atomic percent. In another embodiment, the boron content, i.e., y, in the carbon-rich carbon boron nitride dielectric film 14 is from 15 atomic percent to about 32 atomic percent.

The carbon-rich carbon boron nitride dielectric film 14 also includes nitrogen. The nitrogen content, i.e., z, in the carbon-rich carbon boron nitride dielectric film 14 is from 8 atomic percent to 33 atomic percent. In another embodiment, the nitrogen content, i.e., z, in the carbon-rich carbon boron nitride dielectric film 14 is from 15 atomic percent to 33 atomic percent. In some embodiments, the nitrogen is uniformly distributed throughout the entirety of the carbon-rich carbon boron nitride dielectric film 14. In yet another embodiment of the preset disclosure, the nitrogen is provided in selected regions of the carbon-rich carbon boron nitride dielectric film 14 providing a graded, in terms of nitrogen content, dielectric film.

In some embodiments, the sum of x (carbon content), y (boron content) and z (nitrogen content) adds up to 100 atomic percent. In such an embodiment, no other elements besides carbon, boron, and nitrogen are present in the carbon-rich carbon boron nitride dielectric film 14. In some other embodiments, the sum of x (carbon content), y (boron content) and z (nitrogen content) does not add up to 100 atomic percent. In such embodiments, elements such as, e.g., oxygen and/or hydrogen can be present in the carbon-rich carbon boron nitride dielectric film 14.

When oxygen is present in the carbon-rich carbon boron nitride dielectric film 14, the content of oxygen can range from 1 atomic percent to 10 atomic percent. In another embodiment and when oxygen is present in the carbon-rich carbon boron nitride dielectric film 14, the oxygen content can be from 1 atomic percent to 4 atomic percent.

When hydrogen is present in the carbon-rich carbon boron nitride dielectric film 14, the content of hydrogen can vary from 10 atomic percent to 40 atomic percent. In another embodiment and when hydrogen is present in the carbon-rich carbon boron nitride dielectric film 14, the hydrogen content can be from 10 atomic percent to 25 atomic percent.

In one embodiment, the carbon-rich carbon boron nitride dielectric film 14 has a modulus ranging from 40 GPa to 90 GPa. In another embodiment, and for an as-deposited carbon-rich carbon boron nitride dielectric film, the carbon-rich dielectric film has a compressive stress ranging from 200 MPa to 800 MPa. In yet another embodiment, and for a UV cured (450 seconds to 1450 seconds) carbon-rich carbon boron nitride dielectric film, the carbon-rich dielectric film has a compressive stress from 150 MPa to 50 MPa.

The carbon-rich carbon boron nitride dielectric film 14 can be formed by first placing substrate 10 into a reactor chamber, providing to the reactor chamber at least one precursor containing at least atoms of C, B and N, and depositing the carbon-rich carbon boron nitride dielectric film 14 on a surface of the substrate 12. In one embodiment, the deposition of the carbon-rich carbon boron nitride dielectric film 14 can be performed by a plasma enhanced chemical vapor deposition (PECVD) process. In another embodiment, the deposition of the carbon-rich carbon boron nitride dielectric film 14 can be performed by chemical vapor deposition (CVD), atomic layer deposition (ALD), or a spin on process. Other deposition processes as also possible so long as the other deposition processes are capable of forming the carbon-rich carbon boron nitride dielectric film described above.

The thickness of the carbon-rich carbon boron nitride dielectric film 14 may vary; typical ranges for the carbon-rich carbon boron nitride dielectric film 14 are from 1 nm to 500 nm, with a thickness typically ranging from 5 nm to 200 nm.

The carbon-rich carbon boron nitride dielectric film 14 can be deposited using various precursors that can be in a liquid, gas or vapor state. In one embodiment, the carbon-rich carbon boron nitride dielectric film 14 can be formed utilizing all gaseous precursors. In this embodiment, a boron-containing precursor, a nitrogen-containing precursor and a hydrocarbon-containing precursor can be employed. In some embodiments, the boron-containing precursor and the nitrogen-containing precursor can be combined into a single precursor. In yet other embodiments, the boron-containing precursor, the nitrogen-containing precursor and the hydrocarbon-containing precursor can all be combined into a single-precursor.

In another embodiment, the carbon-rich carbon boron nitride dielectric film 14 can be formed utilizing at least one gaseous precursor and at least one liquid precursor. E.g., the carbon-rich carbon boron nitride dielectric film 14 can be formed utilizing a boron and nitrogen containing liquid precursor and a hydrocarbon-containing gas precursor.

When a boron-containing precursor (liquid, vapor or gas) is employed in forming the carbon-rich carbon boron nitride dielectric film 14, the boron-containing precursor includes any material that includes boron. Examples of boron-containing precursors that can be employed in the present disclosure include, but are not limited to, diborane, triethyl borane, boron trichloride, and boron triflouride.

When a nitrogen-containing precursor (liquid, vapor or gas) is employed in forming the carbon-rich carbon boron nitride dielectric film 14, the nitrogen-containing precursor includes any material that includes nitrogen. Examples of nitrogen-containing precursors that can be employed in the present disclosure include, but are not limited to, $N_2$ and $NH_3$. Non-graded and graded in terms of nitrogen content carbon-rich dielectric films are contemplated. Grading is achieved by varying the amount of nitrogen-containing precursor introduced into the reactor.

The hydrocarbon-containing precursors (liquid, vapor or gas) that can be employed in forming the carbon-rich carbon boron nitride dielectric film 14 are unsaturated hydrocarbons having one or more double or triple bonds between carbon atoms. Unsaturated hydrocarbon-containing precursors with a double bond can be referred to herein as alkenes and are characterized as having the formula $C_nH_{2n}$ wherein n is an integer of 2 or greater, with a value of n being from 2 to 16 being typically employed. Examples of alkenes that can be employed as the hydrocarbon-containing precursor include, but are not limited to, $C_2H_4$, $C_2H_6$, $C_3H_6$ and $C_4H_8$.

Unsaturated hydrocarbons containing triple bonds can be referred herein as alkynes and are characterized as having a general formula $C_mH_{2m-2}$, wherein m is an integer of 2 or greater, with a value of m being from 2 to 16 being typically employed. Examples of alkynes that can be employed as the hydrocarbon-containing precursor include, but are not limited to, $C_2H_2$.

When a combined nitrogen and boron-containing precursor is employed in forming the carbon-rich carbon boron nitride dielectric film 14, the combined nitrogen and boron-containing precursor includes both nitrogen and boron in a single compound. Examples of combined nitrogen and boron-containing precursors that can be employed in the present disclosure include, but are not limited to, borazine, alkyl borazines, vinyl borazine, and vinyl alkyl borazine.

When a combined nitrogen, boron and hydrocarbon-containing precursor is employed in forming the carbon-rich carbon boron nitride dielectric film 14, the combined nitrogen, boron and hydrocarbon-containing precursor includes nitrogen, boron and a hydrocarbon in a single compound. Examples of combined nitrogen, boron and hydrocarbon-containing precursors that can be employed include, but are not limited to a combination of diborane, $NH_3$ and an alkene. In some embodiments, a combination of diborane, $NH_3$ and, mono-, di-, tri- and tetra-alkyl diborane can be used. In other embodiments, precursors with ammonia, and trimethylamine alkyl borane can be used.

In one embodiment, the carbon-rich carbon boron nitride dielectric film 14 can be deposited using a method the includes the step of providing a parallel plate reactor, which has a conductive area of a substrate chuck between 85 $cm^2$ and 1600 $cm^2$, and a gap between the substrate and a top electrode between 1 cm and 12 cm. A high frequency RF power can be applied to one of the electrodes at a frequency from 0.45 MHz to 200 MHz. Optionally, an additional low frequency power can be applied to one of the electrodes. The conditions used for the deposition step in this particular embodiment may vary depending on the desired final dielectric constant of the carbon-rich carbon boron nitride dielectric film 14. Broadly, the conditions used for providing a carbon-rich carbon boron nitride dielectric film 14 having a dielectric constant of equal to, or less than 3.6 include: setting the substrate temperature at a temperature from 200° C. to 425° C.; setting the high frequency RF power density within a range from 0.1 W/cm$^2$ to 1.5 W/cm$^2$; setting the boron-containing precursor flow rate within a range from 100 mg/min to 3000 mg/min as liquid precursors (or 50 sccm to 1000 sccm as gas precursor), setting the nitrogen-containing precursor flow rate within a range from 20 sccm to 1000 sccm and setting the hydrocarbon-containing precursor flow rate within a range from 50 sccm to 2000 sccm; optionally setting an inert carrier gases such as helium (or/and argon) flow rate within a range from 50 sccm to 5000 sccm; setting the reactor pressure at a pressure within a range from 1000 mTorr to 7000 mTorr; and setting the high frequency RF power within a range from 75 W to 1000 W. Optionally, an ultra low frequency power may be added to the plasma within a range from 30 W to 400 xW. When the conductive area of the substrate chuck is changed by a factor of X, the RF power applied to the substrate chuck may also change by a factor of X. Other conditions and precursors can be used as long as they are capable of being able to deposit the carbon-rich carbon boron nitride dielectric film described above.

After deposition of the carbon-rich carbon boron nitride dielectric film 14, the deposited carbon-rich carbon boron nitride dielectric film 14 can be optionally subjected to a curing step that is performed in a non-oxidizing ambient. By "curing" it is meant that the deposited is optionally, but not necessarily is heat treated at a temperature, in at least one of the heating cycles, of not less than 300° C., preferably at a temperature from 300° to 420° C., for a time period of at least 0.10 hour. By "non-oxidizing ambient" it is meant an atmosphere in which the oxygen content is less than 20 ppm. In some embodiments, a non-oxidizing ambient containing oxygen in an amount of less than 10 ppm can be employed. It is noted that curing can occur in the same reactor chamber as used in depositing the carbon-rich carbon boron nitride dielectric film 14 or curing may be performed in a separate reactor chamber. The thermal treatment step, i.e., curing, may include a rapid thermal anneal, a furnace anneal, a laser anneal or a spike anneal. In some embodiments, curing is performed in an oxygen free atmosphere such as, e.g. an inert gas (e.g., He, Ar or mixtures thereof).

In yet other embodiments of the present disclosure, the curing step may be performed at a single temperature. In some further embodiments of the present disclosure, the curing step may occur at two or more different temperatures. For instance, in one embodiment, curing can be performed at a temperature not higher than 300° C. for a first period of time and then at a second temperature not lower than 400° C. for a second period of time, the second period of time being longer than the first period of time. In some embodiments, the second period of time may be at least 10 times greater than the first period of time.

The carbon-rich carbon boron nitride dielectric film 14 can also be cured utilizing a high energy post deposition processing step. Such a high energy post deposition processing step can be performed at shorter times than the thermal cure mentioned above. Specifically, the carbon-rich carbon boron nitride dielectric film 14 can be processed using a high energy source. Suitable energy sources that can be used for the post processing step include chemical, ultraviolet (UV) light, electron beam (E-beam), microwave, and plasma. Combinations of the aforementioned energy sources alone, or with a thermal cure, can be used with a shorter curing time of less than or equal to 5 minutes. The post treatment by thermal and/or high energy UV/E-Beam cure drives up any loosely hydrocarbon that incorporates in the film structure during plasma deposition with the hydrocarbon-containing precursor. This treatment will generate a small amount of nanoporosity in the carbon-rich carbon boron nitride dielectric film 14. By "small" it is meant that the nanoporosity of the carbon-rich carbon boron nitride dielectric film 14 is from 0.5 nm to 3 nm in which the normal preferable range is 0.5 nm to 1.2 nm.

The UV light treatment step can be performed utilizing a source that can generate light having a wavelength from 500 nm to 150 nm, to irradiate the substrate while the wafer temperature is typically maintained at a temperature from 25° C. to 500° C., with temperatures from 300° C. to 420° C. being typical. Radiation with less than 370 nm is of insufficient energy to dissociate or activate important bonds, so the wavelength range 150-370 nm is typically employed in the present disclosure. Using literature data and absorbance spectra measured on as deposited carbon-rich dielectric films, the inventors have found that less than 170 nm radiation may not be favored due to degradation of the carbon-rich dielectric film. Further, the energy range 310-370 nm is less useful than the range 150-310 nm, due to the relatively low energy per photon from 310-370 nm. Within the 150-310 nm range, optimum overlap with the absorbance spectrum of the as deposited film and minimum degradation of the film properties (such as hydrophobicity) may be optionally used to select a most effective region of the UV spectrum for changing the carbon-rich dielectric film's properties.

The electron beam treatment step is performed utilizing a source that is capable of generating a uniform electron flux over the wafer, with energies from 0.5 keV to 25 keV and current densities from 0.1 microAmp/cm$^2$ to 100 microAmp/cm$^2$, while the wafer temperature is maintained at a temperature from 25° C. to 500° C. In one embodiment, the dose of electrons used in the electron beam treatment step varies from 50 microcoulombs/cm$^2$ to 500 micro-coulombs/cm$^2$. In one embodiment, and for a 400-900 nm thick UV cured (450-1450 seconds) carbon-rich carbon boron nitride dielectric film, the carbon-rich dielectric film has a modulus in a range from 30 GPa to 90 GPa, a compressive stress from 150 MPa to 800 MPa and a dielectric constant in a range of 3.2-5.0.

Figure 3:
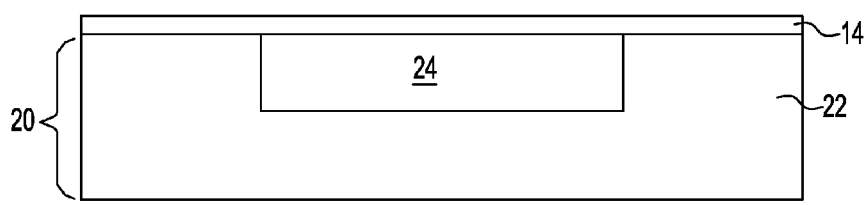
FIG. 3 is a cross-sectional view illustrating another initial structure that can be employed in the present invention in which a carbon-rich carbon boron nitride dielectric film is formed thereon.

Reference is now made to FIG. 3, which illustrates a carbon-rich carbon boron nitride dielectric film 14 that is formed atop a surface of an interconnect structure. 20. The interconnect structure 20 includes an interconnect dielectric material 22 having at least one conductive material 24 embedded therein. The interconnect structure 20 can be formed utilizing conventional processing steps well known to those skilled in the art. For example, a single damascene or a dual damascene process can be employed. In this particular embodiment, the carbon-rich carbon boron nitride dielectric film 14 serves as a dielectric cap for the interconnect structure 20. In some embodiments of the present disclosure, the carbon-rich carbon boron nitride dielectric 14 completely covers the entire top surface of the interconnect structure 20. In another embodiment, the carbon-rich carbon boron nitride dielectric film 14 only is located atop the at least one conductive material 24. In yet another embodiment, the carbon-rich carbon boron nitride dielectric film partially covers the at least one conductive material 24 and partially, or completely covers the interconnect dielectric material 22.

The interconnect dielectric material 22 includes any interlevel or intralevel dielectric including inorganic dielectrics or organic dielectrics. The interconnect dielectric material 22 may be porous, non-porous or contain regions and/or surfaces that are porous and other regions and/or surfaces that may be non-porous. Some examples of suitable dielectrics that can be used as the interconnect dielectric material 22 include, but are not limited to, silicon dioxide, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, e.g., oxygen, sulfur, sulfone, sulfoxide, carbonyl and the like. The at least one conductive material 24 can include e.g., polySi, an elemental metal, alloys of elemental metals, a metal silicide, and/or a metal nitride. The interconnect dielectric material 22 can be formed utilizing conventional techniques well known in the art including, e.g., chemical vapor deposition, plasma enhanced chemical vapor deposition, evaporation and spin-on coating. Likewise, the at least one conductive material 24 can be formed utilizing conventional deposition techniques well known in the art including, e.g., plating, sputtering, physical vapor deposition, evaporation and chemical vapor deposition.

Figure 4A:
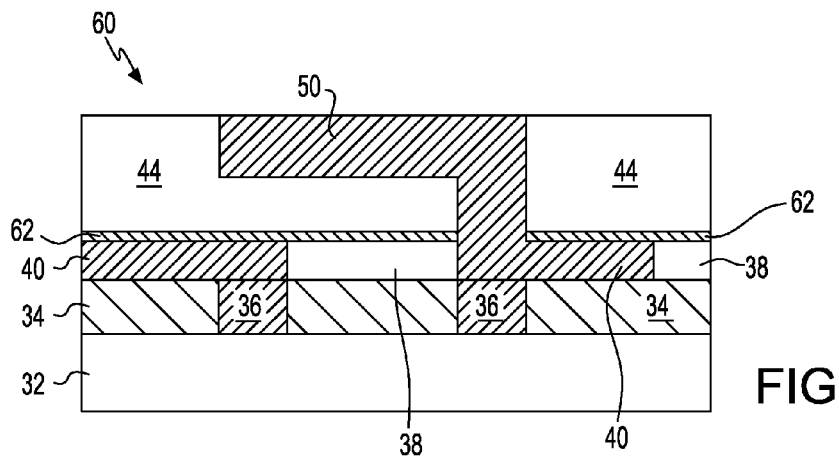
FIGS. 4A, 4B and 4C are cross-sectional views depicting some exemplary electronic devices including a carbon-rich carbon boron nitride dielectric film.
Figure 4B:
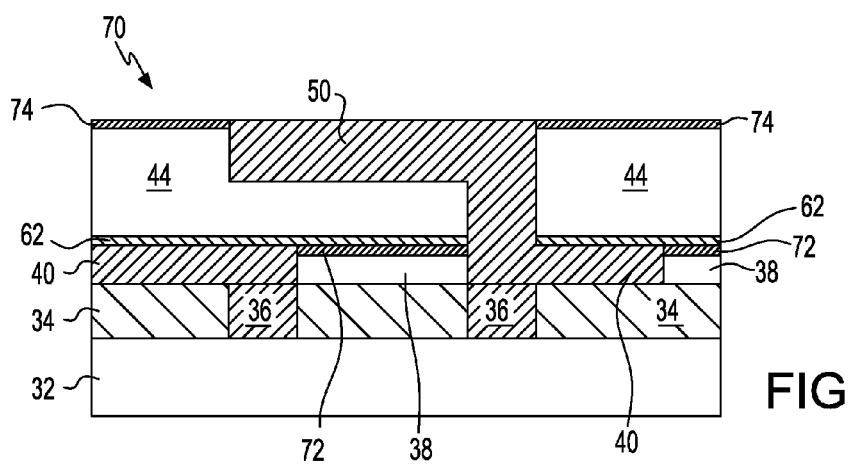
Figure 4C:
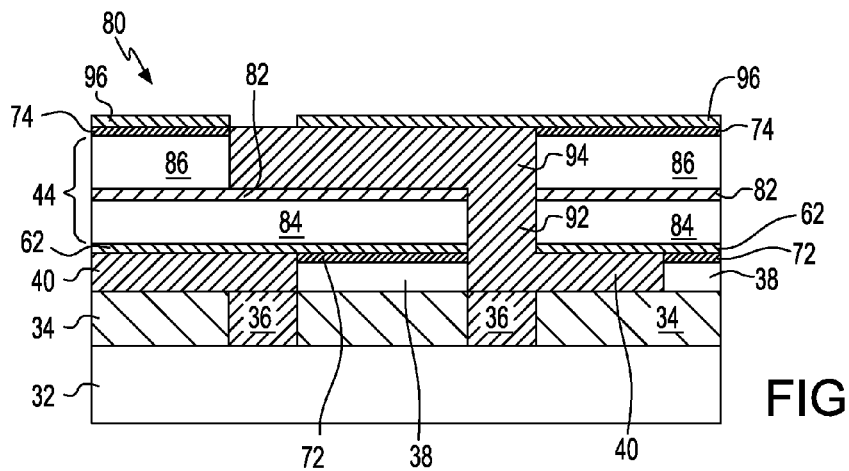

Additional electronic devices which can contain the carbon-rich carbon boron nitride film are shown in FIGS. 4A, 4B and 4C. It should be noted that the devices shown in FIGS. 4A, 4B and 4C are merely illustrative examples.

In FIG. 4A, an electronic device 60 built on a semiconductor substrate 32 is shown. On top of the substrate 32, a first layer of an interconnect dielectric material 34 is first formed with a first region of conductive material 36 embedded therein. After a CMP process is conducted on the first region of conductive material 36, a second layer of interconnect dielectric material 38 is formed on top of the first layer of interconnect dielectric material 34 and the first region of conductive material 36. The first and second layers of interconnect dielectric material may be suitably formed of one of dielectric materials mentioned above for interconnect dielectric material 22, while the first region of conductive material 36 may comprise one of the metals mentioned above for conductive material 24. The second layer of interconnect dielectric material 38 is then patterned in a photolithography process followed by etching and a conductor layer 40 (which may be the same or different material as the first conductor layer 36) is deposited thereon. After a CMP process on the conductor layer 40 is carried out, a third layer of interconnect dielectric material 44 (which may be the same or different dielectric material than the first and second interconnect dielectric layers) is formed overlying the second layer of interconnect dielectric material 38 and the conductor layer 40. The conductor layer 40 is in electrical communication with the first region of conductive material 36.

A second region of conductive material 50 is then formed after a photolithographic process on the third layer of interconnect dielectric material 44 is conducted followed by etching and then a deposition process for a second conductor material. The second region of conductive material 50 may be one of the materials mentioned above for conductive material 24. The second region of conductive material 50 is in electrical communication with the first region of conductive material 40 and is embedded in the third layer of the interconnect dielectric material 44. The third layer of interconnect dielectric material 44 is in intimate contact with the second layer of interconnect dielectric material 38, which, in some embodiments can be composed of the carbon-rich carbon boron nitride film of the present invention.

FIG. 4A also shows a dielectric cap layer 62 deposited between the second layer of interconnect dielectric material 38 and the third layer of interconnect dielectric material 44. The dielectric cap layer 62 can include the carbon-rich carbon boron nitride film of the present invention. The dielectric cap layer 62 functions as a diffusion barrier layer for preventing diffusion of the first conductor layer 40 into the third layer of interconnect material 44 or into the lower layers, especially into layers 34 and 32.

FIG. 4B illustrates an alternate electronic device 70. In the electronic device 70, two additional dielectric cap layers 72 and 74 which act as a RIE mask and CMP (chemical mechanical polishing) polish stop layer are used. The first dielectric cap layer 72 is deposited on top of the second layer of interconnect dielectric material 38 and is used as an RIE mask and CMP stop, so the first conductor layer 40 and layer 72 are approximately co-planar after CMP. The function of the second dielectric cap layer 74 is similar to layer 72, however, layer 74 is utilized in planarizing the second conductor layer 50. The polish stop layer 74 can be deposited of a suitable dielectric material such as silicon oxide, silicon nitride, silicon oxynitride, silicon carbide, silicon carbo-oxide (SiCO), Silicon Carbo-oxynitride (SiCON), or their hydrogenated compounds. Alternatively, the carbon-rich carbon boron nitride dielectric film of the present disclosure can be used as the material for polish stop layer 74.

FIG. 4C illustrates yet another alternate electronic device 80. In this embodiment, an additional layer 82 of dielectric material is deposited and thus dividing the third layer of interconnect dielectric material 44 into two separate layers 84 and 86. In one embodiment, the additional layer 82 of dielectric material can include the carbon-rich carbon boron nitride dielectric film of the present disclosure. An additional diffusion barrier layer 96 (which may be comprised of the carbon-rich carbon boron nitride dielectric film of the present disclosure) is further deposited on top of the upper dielectric layer 74. The additional benefit provided by electronic device 80 is that dielectric layer 82 acts as an RIE etch stop providing superior interconnect depth control. Thus, the composition of layer 82 is selected to provide etch selectivity with respect to layer 86.

Another alternate embodiment may include an electronic device which has layers of insulating material as intralevel or interlevel dielectrics in a wiring structure that includes a pre-processed semiconducting substrate which has a first region of metal embedded in a first layer of insulating material, a first region of conductor embedded in a second layer of the insulating material wherein the second layer of insulating material is in intimate contact with the first layer of insulating material, and the first region of conductor is in electrical communication with the first region of metal, a second region of conductor in electrical communication with the first region of conductor and is embedded in a third layer of insulating material, wherein the third layer of insulating material is in intimate contact with the second layer of insulating material, a first dielectric cap layer between the second layer of insulating material and the third layer of insulating material and a second dielectric cap layer on top of the third layer of insulating material, wherein the first and the second dielectric cap layers are formed of the carbon-rich carbon boron nitride dielectric film.

A further alternate embodiment may include an electronic device which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor that is in electrical communication with the first region of conductor and is embedded in a third layer of insulating material, the third layer of insulating material is in intimate contact with the second layer of insulating material, and a diffusion barrier layer formed of the carbon-rich carbon boron nitride dielectric film deposited on at least one of the second and third layers of insulating material.

A yet a further alternate embodiment may include an electronic device which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a reactive ion etching (RIE) hard mask/polish stop layer on top of the second layer of insulating material, and a diffusion barrier layer on top of the RIE hard mask/polish stop layer, wherein the RIE hard mask/polish stop layer and the diffusion barrier layer are formed of the carbon-rich carbon boron nitride dielectric film of the present disclosure.

A still further alternate embodiment may include an electronic device which has layers of insulating materials as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a first RIE hard mask, polish stop layer on top of the second layer of insulating material, a first diffusion barrier layer on top of the first RIE hard mask/polish stop layer, a second RIE hard mask/polish stop layer on top of the third layer of insulating material, and a second diffusion barrier layer on top of the second RIE hard mask/polish stop layer, wherein the RIE hard mask/polish stop layers and the diffusion barrier layers are formed of the carbon-rich carbon boron nitride dielectric film of the present disclosure.

Figure 5:
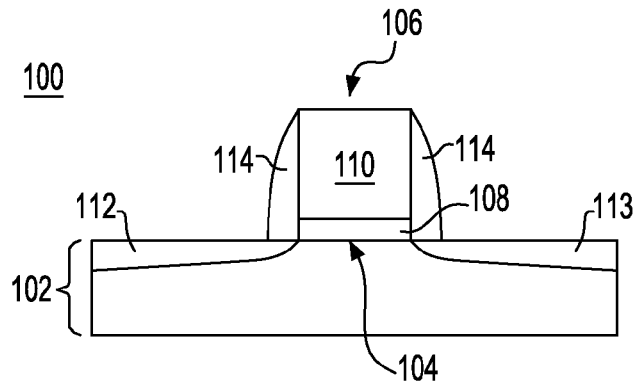
FIG. 5 is a cross-sectional view depicting an electronic device including a carbon-rich carbon boron nitride dielectric film as a gate spacer.

Reference is now made to FIG. 5 which illustrates an electronic device 100 including a carbon-rich carbon boron nitride dielectric spacer 114. In this embodiment, the electronic device 100 can fabricated using any conventional FET process flow, including a replacement gate process. In some embodiments the FET process that can be used includes deposition of the various material layers, lithography and etching.

The following discussion of planar device geometry for spacer application is for illustrative purposes only and, as such, the present disclosure is not limited to planar device architecture. Instead, the carbon-rich carbon boron nitride dielectric spacer can be used in 3D device architectures such as, e.g., finFET, trigate, double gate, and Si nanowire devices as well.

The electronic device 100 includes a semiconductor substrate 102 including one of the semiconductor materials mentioned above. A portion of the semiconductor substrate 102, that is located beneath gate stack 106, defines a channel region 104 of the device. The gate stack 106 includes at least one gate dielectric material 108 and a gate conductor 110 located thereon. At the footprint of the gate stack 108 and located in the semiconductor substrate 102 there is a source region 112 and a drain region 113. The source region 112 and the drain region 113 are connected via the channel region 104.

Preferably, one gate dielectric material 108 can include an oxide, a nitride, an oxynitride or a multilayered stack thereof. In one embodiment, the at least one gate dielectric material 108 includes a semiconductor oxide, a semiconductor nitride or a semiconductor oxynitride. In another embodiment, the at least one gate dielectric material 108 includes a dielectric metal oxide or mixed metal oxide having a dielectric constant that is greater than the dielectric constant of silicon oxide, e.g., 3.9. Typically, one of the dielectrics of the at least one gate dielectric material 108 has a dielectric constant greater than 4.0, with a dielectric constant of greater than 8.0 being more typical. Such dielectric materials are referred to herein as a high k dielectric. Exemplary high k dielectrics include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Multilayered stacks of these high k materials can also be employed as the at least one gate dielectric material 108. Each value of x is independently from 0.5 to 3 and each value of y is independently from 0 to 2. The thickness of the at least one gate dielectric material 108 is typically from 1 nm to 10 nm, with a thickness typically ranging from 2 nm to 5 nm.

The gate conductor 110 includes a conductive material such as, but not limited to, polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. In one embodiment, the conductive material that can be employed as gate conductor 110 can be comprised of an nFET metal gate. In another embodiment, the conductive material that can be employed as gate conductor 110 can be comprised of a pFET metal gate. In a further embodiment, the conductive material that can be employed as gate conductor 110 can be comprised of polycrystalline silicon. The polysilicon conductive material can be used alone, or in conjunction with another conductive material such as, e.g., a metal conductive material and/or a metal silicide material. The gate conductor 110 typically has a thickness from 1 nm to 100 nm, with a thickness from 3 nm to 30 nm being even more typical.

As shown in FIG. 5, a carbon-rich carbon boron nitride spacer 114 is located on sidewalls of the gate stack 106. In this embodiment, the carbon-rich carbon boron nitride spacer 114 is formed by first depositing a carbon-rich carbon boron nitride film as described above on the structure and then etching the film so as to form spacer 114 on the sidewalls of the gate stack 106. The presence of the carbon-rich carbon boron nitride spacer 114 of the present disclosure on the sidewalls of the gate stack 106 reduces the parasitic capacitance in the FET device. The multilayer cyclic PECVD process for the carbon-rich carbon boron nitride dielectric films described herein can enable excellent step coverage with low microloading and the hydrophobic nature of the carbon-rich carbon boron nitride dielectric films produces good wet etch resistance much desired in spacer applications.

Figure 6A:
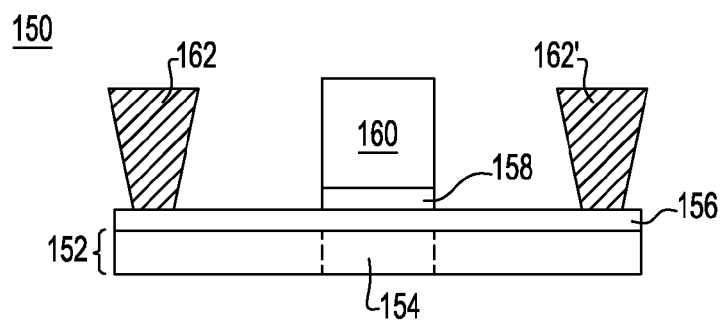
FIGS. 6A and 6B are cross sectional views depicting electronic devices including a carbon-rich carbon boron nitride dielectric film located atop a layer of a carbon-based substrate.
Figure 6B:
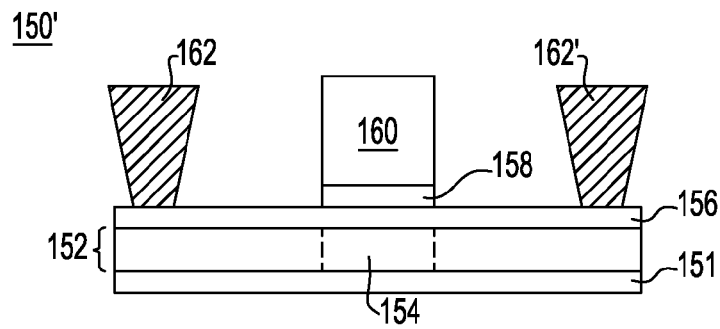

Reference is now made to FIGS. 6A and 6B which illustrate exemplary electronic devices including a carbon-rich carbon boron nitride dielectric film located atop a layer of a carbon-based material substrate. Referring first now to FIG. 6A, there is illustrated one type of electronic device 150 that can be fabricated using any conventional FET process flow, including a replacement gate process. In some embodiments the FET process that can be used includes deposition of the various material layers, lithography and etching.

In particular, FIG. 6A illustrates an electronic device 150 that includes a carbon-based material as a substrate 152, wherein a portion of the carbon-based material defines a device channel 154. At least one layer of an interfacial dielectric material 156 is located on an upper surface of the device channel 154. The interfacial dielectric material 156 includes the carbon-rich carbon boron nitride dielectric film of the present disclosure. At least one layer of a dielectric material 158 is located on an uppermost surface of the at least one layer of interfacial dielectric material 156, and at least one layer of a conductive material 160 is located on an uppermost surface of the at least one layer of dielectric material 158. It is noted that the dielectric material 158 and the conductive material 160 mentioned within this particular embodiment of the present disclosure are composed of one of the dielectric materials and conductive materials mentioned above for the at least one gate dielectric material 108 and the gate conductor 110 in FIG. 5. The electronic device 150 shown in FIG. 6A further includes at least two regions 162, 162' that make electrical contact to portions of the carbon-based material 152 that are adjacent to the device channel 154. The two regions 162, 162' are the source/drain regions of the electronic device 150 and they include one of the conductive materials mentioned above for the gate conductor 110. In one embodiment, the at least two regions 162, 162' are composed of graphene or carbon based materials. The at least two regions 162, 162' are formed by deposition, lithography and etching. In one embodiment (not shown), the at least two regions 162, 162' are in direct contact with the carbon-based material 152. Such a device is achieved by removing portions of the at least one layer of interfacial dielectric material 156 by etching. In another embodiment, the at least two regions 162, 162' are in direct contact with a portion of the at least one layer of interfacial dielectric material 156. In electronic structure 150, the interfacial dielectric material 152 has a high affinity for bonding with the underlying carbon-based material 152.

Referring now to FIG. 6B, there is illustrated a second type of electronic device 150' that includes a carbon-based material 152 as a substrate, wherein a portion of the carbon-based material defines a device channel 154. In this electronic structure, a back gate layer which is labeled as 151, is present and this layer may be patterned or may be present throughout an array of devices as a blanket layer. The back-gate layer comprises an conductive material including a doped Si-containing material, a conductive metal, a conductive metal alloy, a conductive metal nitride and/or a conductive metal silicide. At least one layer of an interfacial dielectric material 156 (which is comprised of the carbon-rich carbon boron nitride dielectric film of the present disclosure) is located on an upper surface of the device channel 154. At least one layer of a dielectric material 158 is located on an uppermost surface of the at least one layer of interfacial dielectric material 156, and at least one layer of a conductive material 160 is located on an uppermost surface of the at least one layer of dielectric material 158. It is noted that the dielectric material 158 and the conductive material 160 mentioned within this particular embodiment of the present are composed of one of the dielectric materials and conductive materials mentioned above for the at least one gate dielectric material 108 and the gate conductor 110 in FIG. 5. The electronic device 150' shown in FIG. 6B further includes at least two regions 162, 162' that make electrical contact to portions of the carbon-based material 152 that are adjacent to the device channel 154. The two regions 162, 162' are the source/drain regions of the electronic device 150' and they include one of the conductive materials mentioned above for gate conductor 110. In one embodiment, the at least two regions 162, 162' are composed of graphene or a carbon based material. The at least two regions 162, 162' are formed by deposition, lithography and etching. In one embodiment (not shown), the at least two regions 162, 162' are in direct contact with the carbon-based material 152. Such a device is achieved by removing portions of the at least one layer of interfacial dielectric material 156 by etching. In another embodiment, the at least two regions 162, 162' are in direct contact with a portion of the at least one layer of interfacial dielectric material 156. In the electronic structure 150', the interfacial dielectric material 152 has a high affinity for bonding with the underlying carbon-based material 152.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed as new is:

1. A dielectric film having a formula of $C_xB_yN_z$ wherein x is 35 atomic percent or greater, y is from 6 atomic percent to 32 atomic percent and z is from 8 atomic percent to 33 atomic percent, wherein said nitrogen is uniformly distributed throughout the dielectric film.

2. The dielectric film of claim 1, wherein said dielectric film has a dielectric constant of equal to, or less than 3.6.

3. The dielectric film of claim 2, wherein said dielectric constant is from 2.5 to 3.2.

4. The dielectric film of claim 1, wherein x is from 35 atomic percent to 70 atomic percent, y is from 15 atomic percent to 32 atomic percent, and z is from 15 atomic percent to 33 atomic percent.

5. A dielectric film having a formula of $C_xB_yN_z$ wherein x is 35 atomic percent or greater, y is from 6 atomic percent to 32 atomic percent and z is from 8 atomic percent to 33 atomic percent, wherein said nitrogen is provided in selected regions within a depth of the dielectric film providing a graded film.

6. An electronic device comprising:
a substrate; and
a dielectric film located on a surface of said substrate, wherein said dielectric film has a formula of $C_xB_yN_z$ wherein x is 35 atomic percent or greater, y is from 6 atomic percent to 32 atomic percent and z is from 8 atomic percent to 33 atomic percent, wherein said nitrogen is uniformly distributed throughout the dielectric film or is provided in selected regions within the depth of the dielectric film providing a graded film.

7. The electronic device of claim 6, wherein said substrate is an interconnect dielectric material having at least one conductive material located therein, and wherein said dielectric film is located on at least an exposed surface of the at least one conductive material.

8. The electronic device of claim 6, wherein said substrate is a patterned gate stack, and said dielectric film is located on sidewalls of said patterned gate stack.

9. The electronic device of claim 6, wherein said substrate is a carbon-based material.

10. The electronic device of claim 9, wherein said carbon-based material is selected from the group consisting of graphene, graphite and a carbon nanotube.

11. The electronic device of claim 9, further comprising at least one layer of a dielectric material and at least one layer of a conductive material located atop the dielectric film.

12. The electronic device of claim 6, wherein said dielectric film has a dielectric constant of equal to, or less than 3.6.

13. The electronic device of claim 6, wherein x is from 35 atomic percent to 70 atomic percent, y is from 15 atomic percent to 32 atomic percent, and z is from 15 atomic percent to 33 atomic percent.

14. The dielectric film of claim 5, wherein said dielectric film has a dielectric constant of equal to, or less than 3.6.

15. The dielectric film of claim 14, wherein said dielectric constant is from 2.5 to 3.2.

16. The dielectric film of claim 5, wherein x is from 35 atomic percent to 70 atomic percent, y is from 15 atomic percent to 32 atomic percent, and z is from 15 atomic percent to 33 atomic percent.

* * * * *